(12) United States Patent
Ji

(10) Patent No.: US 11,817,163 B2
(45) Date of Patent: Nov. 14, 2023

(54) CIRCUIT FOR DETECTING STATE OF ANTI-FUSE STORAGE UNIT AND MEMORY DEVICE THEREOF

(71) Applicant: CHANGXIN MEMORY TECHNOLOGIES, INC., Hefei (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 183 days.

(21) Appl. No.: 17/400,517

(22) Filed: Aug. 12, 2021

(65) Prior Publication Data
US 2022/0020444 A1 Jan. 20, 2022

Related U.S. Application Data

(63) Continuation of application No. PCT/CN2021/097918, filed on Jun. 2, 2021.

(30) Foreign Application Priority Data

Jul. 16, 2020 (CN) .......................... 202010688530.5

(51) Int. Cl.
G11C 29/02 (2006.01)
G11C 29/50 (2006.01)
G11C 17/16 (2006.01)

(52) U.S. Cl.
CPC ...... G11C 29/027 (2013.01); G11C 29/50008 (2013.01); G11C 17/16 (2013.01);
(Continued)

(58) Field of Classification Search
CPC .......................... G11C 29/027; G11C 29/50008
(Continued)

(56) References Cited

U.S. PATENT DOCUMENTS 7,082,061 B2   7/2006 Chou
7,333,383 B2   2/2008 Vogelsang
(Continued)

FOREIGN PATENT DOCUMENTS

CN    1828764 A     9/2006
CN    100483540 C   4/2009
(Continued)

OTHER PUBLICATIONS

International Search Report in the international application No. PCT/CN2021/097868, dated Aug. 26, 2021, 2 pgs.
(Continued)

Primary Examiner — Ly D Pham
(74) Attorney, Agent, or Firm — Cooper Legal Group, LLC

(57) ABSTRACT

A circuit for detecting a state of an anti-fuse storage unit includes a first current module, a second current module, and a comparator. The first current module has a first end connected to an anti-fuse storage unit array through a first node and a second end connected to a second node. The first current module is configured to output a detection current through the second node. The second current module has a first end connected to a first end of a reference resistor through a third node and a second end connected to a fourth node. A second end of the reference resistor is grounded. The second current module is configured to output a reference current through the fourth node. The comparator has a first input end connected to the second node and a second input end connected to the fourth node.

20 Claims, 14 Drawing Sheets

(52) U.S. Cl.
CPC ............ *G11C 17/165* (2013.01); *G11C 29/50* (2013.01); *G11C 2029/5004* (2013.01)

(58) Field of Classification Search
USPC ...................................................... 365/225.7
See application file for complete search history.

(56) References Cited

U.S. PATENT DOCUMENTS

| | | | |
|---|---|---|---|
| 8,208,336 B2 | 6/2012 | Do | |
| 8,243,542 B2 | 8/2012 | Bae | |
| 8,654,595 B2 | 2/2014 | Kim | |
| 9,099,191 B2 | 8/2015 | Tsai et al. | |
| 9,330,781 B2 | 5/2016 | Kim et al. | |
| 9,564,235 B2 | 2/2017 | Zhou et al. | |
| 10,121,537 B2 | 11/2018 | Rho | |
| 10,403,344 B2 | 9/2019 | Lee | |
| 10,446,204 B2 | 10/2019 | Inaba | |
| 10,459,693 B2 | 10/2019 | Lin et al. | |
| 10,658,048 B2 | 5/2020 | Conte et al. | |
| 10,693,369 B2 | 6/2020 | Ku et al. | |
| 2004/0240255 A1* | 12/2004 | Smith ................ G11C 29/50 365/158 | |
| 2006/0120174 A1 | 6/2006 | Chou | |
| 2007/0165441 A1* | 7/2007 | Kurjanowicz ......... H10B 20/20 257/E27.071 | |
| 2010/0118595 A1 | 5/2010 | Bae | |
| 2010/0277999 A1 | 11/2010 | Do | |
| 2012/0182782 A1* | 7/2012 | Kurjanowicz ......... G11C 17/18 365/94 | |
| 2013/0064008 A1 | 3/2013 | Kim | |
| 2014/0022855 A1* | 1/2014 | Jang ..................... G11C 17/18 365/189.09 | |
| 2014/0355353 A1 | 12/2014 | Tsai et al. | |
| 2015/0078081 A1 | 3/2015 | Zhou et al. | |
| 2015/0235712 A1* | 8/2015 | Kang ..................... G11C 17/16 365/96 | |
| 2015/0287475 A1 | 10/2015 | Kim et al. | |
| 2016/0072493 A1* | 3/2016 | Oh .......................... G11C 7/08 327/51 | |
| 2018/0158523 A1 | 6/2018 | Rho | |
| 2018/0197590 A1 | 7/2018 | Lee | |
| 2018/0277182 A1 | 9/2018 | Inaba | |
| 2019/0114144 A1 | 4/2019 | Lin et al. | |
| 2019/0156909 A1* | 5/2019 | Lee ........................ G11C 29/76 |
| 2019/0369966 A1 | 12/2019 | Hsu | |
| 2019/0372456 A1 | 12/2019 | Ku et al. | |
| 2020/0058360 A1 | 2/2020 | Conte et al. | |

FOREIGN PATENT DOCUMENTS

| | | |
|---|---|---|
| CN | 101916583 A | 12/2010 |
| CN | 103366790 A | 10/2013 |
| CN | 104217744 A | 12/2014 |
| CN | 104505123 A | 4/2015 |
| CN | 104505123 B | 4/2018 |
| CN | 108154894 A | 6/2018 |
| CN | 108288479 A | 7/2018 |
| CN | 108630265 A | 10/2018 |
| CN | 109671457 A | 4/2019 |
| CN | 109799374 A | 5/2019 |
| CN | 105913876 B | 10/2019 |
| CN | 110544500 A | 12/2019 |
| CN | 110838309 A | 2/2020 |
| CN | 210639992 U | 5/2020 |
| CN | 210925501 U | 7/2020 |
| JP | 2001319488 A | 11/2001 |

OTHER PUBLICATIONS

International Search Report in the international application No. PCT/CN2021/100976, dated Sep. 1, 2021, 2 pgs.
International Search Report in the international application No. PCT/CN2021/097849, dated Aug. 26, 2021, 2 pgs.
International Search Report in the international application No. PCT/CN2021/097918, dated Jul. 26, 2021, 2 pgs.

* cited by examiner

600

| S1: Output a first control signal at a first time point through a word line of an anti-fuse storage unit to be detected, so as to electrically connect the anti-fuse storage unit to be detected to a bit line, and output a second control signal to control a first current module to input a detection current to a first input end of a comparator and to control a second current module to input a reference current to a second input end of the comparator |

↓

| S2: Acquire an output signal of the comparator at a second time point, to determine a storage state of the anti-fuse storage unit to be detected |

FIG. 6

CIRCUIT FOR DETECTING STATE OF ANTI-FUSE STORAGE UNIT AND MEMORY DEVICE THEREOF

CROSS-REFERENCE TO RELATED APPLICATIONS

This is a continuation of International Application No. PCT/CN2021/097918, filed on Jun. 2, 2021, and entitled "Circuit for Detecting State of Anti-fuse Storage Unit and Memory Device Thereof", which claims priority to Chinese patent application No. 202010688530.5, filed on Jul. 16, 2020, and entitled "Circuit for Detecting State of Anti-fuse Storage Unit and Memory". The disclosures of International Application No. PCT/CN2021/097918 and Chinese patent application No. 202010688530.5 are hereby incorporated by reference in their entireties.

TECHNICAL FIELD

The present disclosure relates to the technical field of integrated circuits, and in particular to a circuit for detecting a state of an anti-fuse storage unit and a memory device applying the circuit.

BACKGROUND

One-Time Programmable (OTP) memories are widely used in various types of memories to realize redundant replacement of damaged storage units, micro-adjustment of circuit modules, etc. Common OTP memories utilize a breakdown or non-breakdown state of an anti-fuse storage unit for information storage.

The breakdown state of the anti-fuse storage unit is typically detected only by simple logic gate circuits (e.g., inverters). In the related art, an inverter is used to detect a breakdown state of an anti-fuse storage unit, as shown in FIG. 1. If an anti-fuse storage unit 11 to be detected is in a programmed-breakdown state and the path resistance is small, the voltage generated on node Node 1 is low during detection, so that output D_out of the inverter is high. Conversely, if the anti-fuse storage unit 11 to be detected is in an non-programmed-breakdown state and the path resistance is large, the voltage generated on node Node 1 is high and exceeds a turning point of the inverter, so that output D_out of the inverter is low. As the resistance of an anti-fuse storage unit after being broken down may fluctuate in a wide range, and factors such as process, voltage, and temperature affect a turning point of a logic gate circuit such as an inverter, a storage state detection error is easily caused to the anti-fuse storage unit, the chip yield is reduced, and therefore a circuit for detecting a state of an anti-fuse storage unit with better performance is needed urgently.

It should be noted that the information disclosed in the BACKGROUND section is only used to enhance an understanding of the background of the present disclosure, and thus may include information that does not constitute prior art known to those of ordinary skill in the art.

SUMMARY

According to an aspect of the present disclosure, a circuit for detecting a state of an anti-fuse storage unit is provided, which may include a first current module, a second current module, and a comparator. The first current module may have a first end connected to an anti-fuse storage unit array through a first node and a second end connected to a second node. The anti-fuse storage unit array may include at least one bit line that may be each connected to the first node and a plurality of anti-fuse storage units. The first current module may be configured to output a detection current through the second node, the detection current being correlated with a resistance of an anti-fuse storage unit to be detected in the anti-fuse storage unit array. The second current module may have a first end connected to a first end of a reference resistor through a third node and a second end connected to a fourth node. A second end of the reference resistor may be grounded. The second current module may be configured to output a reference current through the fourth node, the reference current being correlated with a resistance of the reference resistor. The comparator may have a first input end connected to the second node and a second input end connected to the fourth node for detecting a storage state of the anti-fuse storage unit to be detected.

According to an aspect of the present disclosure, a method for detecting a state of an anti-fuse storage unit is provided, which may be applied to the circuit for detecting the state of the anti-fuse storage unit as described in any one of the above, and may include: outputting a first control signal to a word line of an anti-fuse storage unit to be detected at a first time point, to electrically connect the anti-fuse storage unit to be detected to a bit line, and outputting a second control signal to control a first current module to input a detection current to a first input end of a comparator and to control a second current module to input a reference current to a second input end of the comparator; and acquiring an output signal of the comparator at a second time point to determine a storage state of the anti-fuse storage unit to be detected. The second time point may follow the first time point.

According to an aspect of the present disclosure, a memory device is provided, which may include the circuit for detecting the state of the anti-fuse storage unit as described in any one of the above.

It should be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this specification, illustrate embodiments consistent with the present disclosure and, together with the specification, serve to explain the principles of the present disclosure. It is apparent to those of ordinary skill in the art that the drawings in the following description are only some embodiments of the present disclosure, and that other drawings may be obtained from these drawings without involving any inventive effort.

FIG. 6 is a flowchart of a method for detecting a controller applied to the circuit shown in FIG. 5.

DETAILED DESCRIPTION

Figure 1:
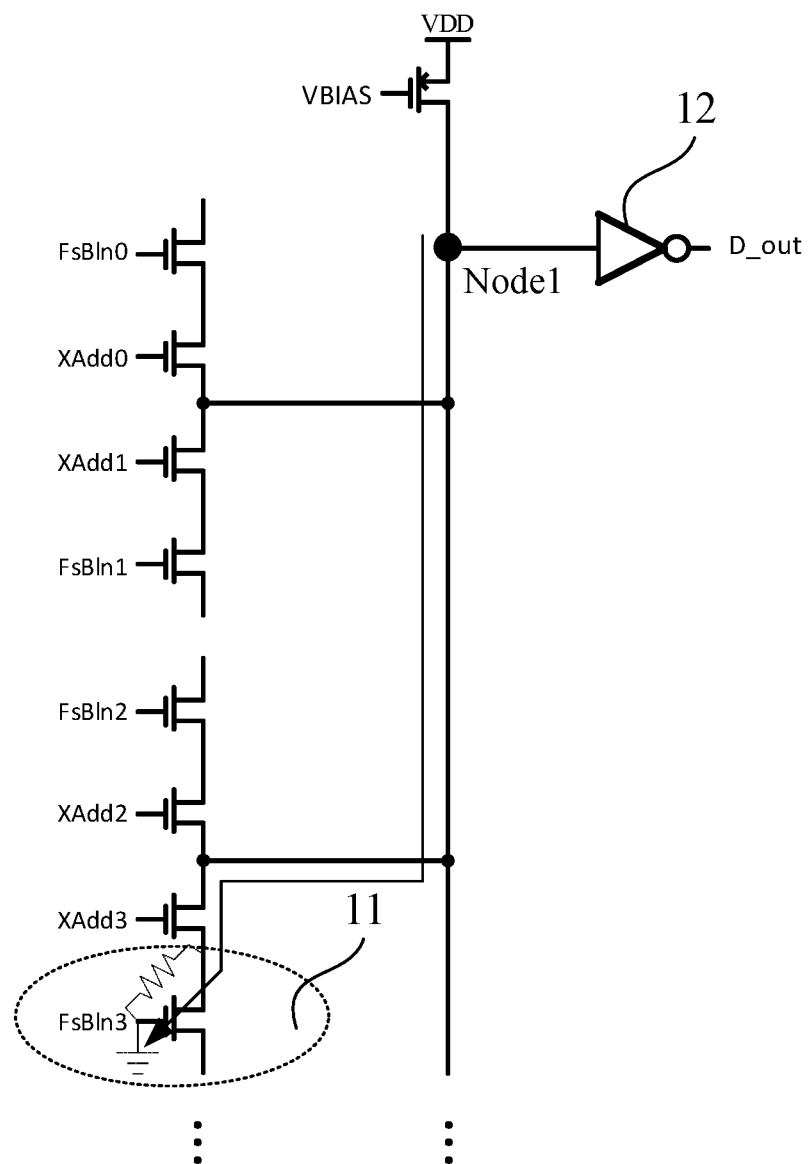
FIG. 1 is a schematic diagram of a circuit for detecting a state of an anti-fuse storage unit in the related art.

Example implementations will now be described more fully with reference to the accompanying drawings. However, the example implementations can be implemented in a variety of forms and should not be construed as limited to the examples set forth herein. Rather, these implementations are provided so that the present disclosure will be thorough and complete, and the concepts of the example implementations are fully communicated to those skilled in the art. The described features, structures, or characteristics may be combined in any suitable manner in one or more implementations. In the following description, numerous specific details are set forth in order to provide a thorough understanding of the implementations of the present disclosure. However, it will be recognized by those skilled in the art that the technical solutions of the present disclosure may be practiced without one or more of the specific details, or with other methods, components, apparatuses, steps, etc. In other cases, well-known technical solutions have not been shown or described in detail to avoid being unoriginal to obscure aspects of the present disclosure.

Further, the drawings are only schematic illustrations of the present disclosure, in which the same reference numerals refer to the same or similar parts, and thus their repeated description will be omitted. Some of the block diagrams shown in the drawings are functional entities and do not necessarily have to correspond to physically or logically independent entities. The functional entities may be implemented in software, or in one or more hardware modules or integrated circuits, or in different network and/or processor apparatuses and/or microcontroller apparatuses.

The example implementations of the present disclosure will now be described in detail in conjunction with the accompanying drawings.

Figure 2:
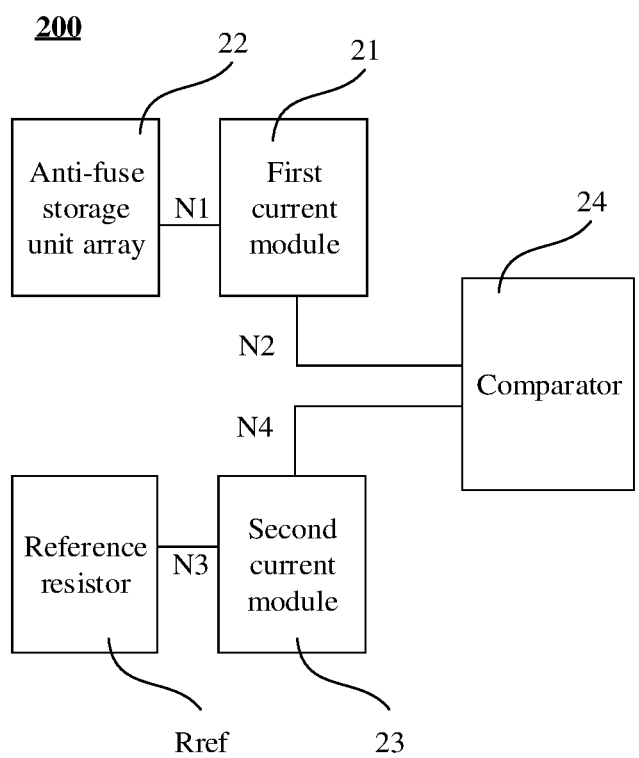
FIG. 2 is a schematic structure diagram of a circuit for detecting a state of an anti-fuse storage unit in exemplary embodiments of the present disclosure.

FIG. 2 is a schematic structure diagram of a circuit for detecting a state of an anti-fuse storage unit in exemplary embodiments of the present disclosure.

Referring to FIG. 2, a circuit for detecting a state of an anti-fuse storage unit may include a first current module 21, a second current module 23, and a comparator 24.

The first current module 21 has a first end connected to an anti-fuse storage unit array 22 through a first node N1 and a second end connected to a second node N2. The anti-fuse storage unit array 22 includes at least one bit line, each connected to the first node N1 and a plurality of anti-fuse storage units. The first current module 21 is configured to output a detection current through the second node N2, the detection current being correlated with a resistance of an anti-fuse storage unit to be detected in the anti-fuse storage unit array 22.

The second current module 23 has a first end connected to a first end of a reference resistor Rref through a third node N3 and a second end connected to a fourth node N4. A second end of the reference resistor Rref is grounded. The second current module 23 is configured to output a reference current through the fourth node N4, the reference current being correlated with a resistance of the reference resistor Rref.

The comparator 24 has a first input end connected to the second node N2 and a second input end connected to the fourth node N4 for detecting a storage state of the anti-fuse storage unit to be detected.

The structures of the anti-fuse storage unit array 22 and the anti-fuse storage units shown in FIG. 2 are described with reference to FIG. 1.

Figure 3:
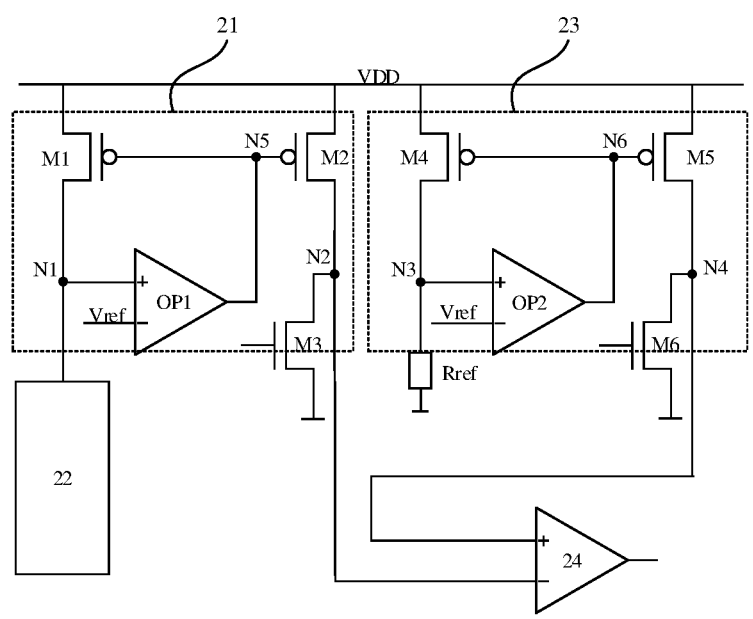
FIG. 3 is a schematic circuit diagram of a circuit for detecting a state of an anti-fuse storage unit in one embodiment of the present disclosure.

FIG. 3 is a schematic circuit diagram of a circuit for detecting a state of an anti-fuse storage unit in one embodiment of the present disclosure.

Referring to FIG. 3, in one embodiment, the first current module 21 may include a first amplifier OP1, a first switching element M1, a second switching element M2, and a third switching element M3.

The first amplifier OP1 has a first input end connected to a reference voltage Vref, a second input end connected to the first node N1, and an output end connected to a fifth node N5.

The first switching element M1 has a first end connected to a power voltage VDD, a second end connected to the first node N1, and a control end connected to the fifth node N5.

The second switching element M2 has a first end connected to the power voltage VDD, a second end connected to the second node N2, and a control end connected to the fifth node N5.

The third switching element M3 has a first end connected to the second node N2, a grounded second end, and a control end connected to a controller (not shown).

The second current module 23 may include a second amplifier OP2, a fourth switching element M4, a fifth switching element M5, and a sixth switching element M6.

The second amplifier OP2 has a first input end connected to the reference voltage Vref, a second input end connected to the third node N3, and an output end connected to a sixth node N6.

The fourth switching element M4 has a first end connected to the power voltage VDD, a second end connected to the third node N3, and a control end connected to the sixth node N6.

The fifth switching element M5 has a first end connected to the power voltage VDD, a second end connected to the fourth node N4, and a control end connected to the sixth node N6.

The sixth switching element M6 has a first end connected to the fourth node N4, a grounded second end, and a control end connected to a controller (not shown).

In the embodiment shown in FIG. 3, if the first switching element M1 and the second switching element M2 are both N-type transistors, the first input end of the first amplifier OP1 is a non-inverting input end, and the second input end is an inverting input end. If the first switching element M1 and the second switching element M2 are both P-type transistors, the first input end of the first amplifier OP2 is an inverting input end, and the second input end is a non-inverting input end. Similarly, if the fourth switching element M4 and the fifth switching element M5 are both N-type transistors, the first input end of the second amplifier OP2 is a non-inverting input end, and the second input end is an inverting input end. If the fourth switching element M4 and the fifth switching element M5 are both P-type transistors, the first input end of the second amplifier OP2 is an inverting input end, and the second input end is a non-inverting input end. For example, when the first switching element M1, the second switching element M2, the fourth switching element M4, and the fifth switching element M5 are all P-type transistors, a connection manner is shown in FIG. 3. Those skilled in the art may determine the connection manner of amplifiers at will according to the types of switching elements, and the present disclosure is not limited thereto.

Figure 4:
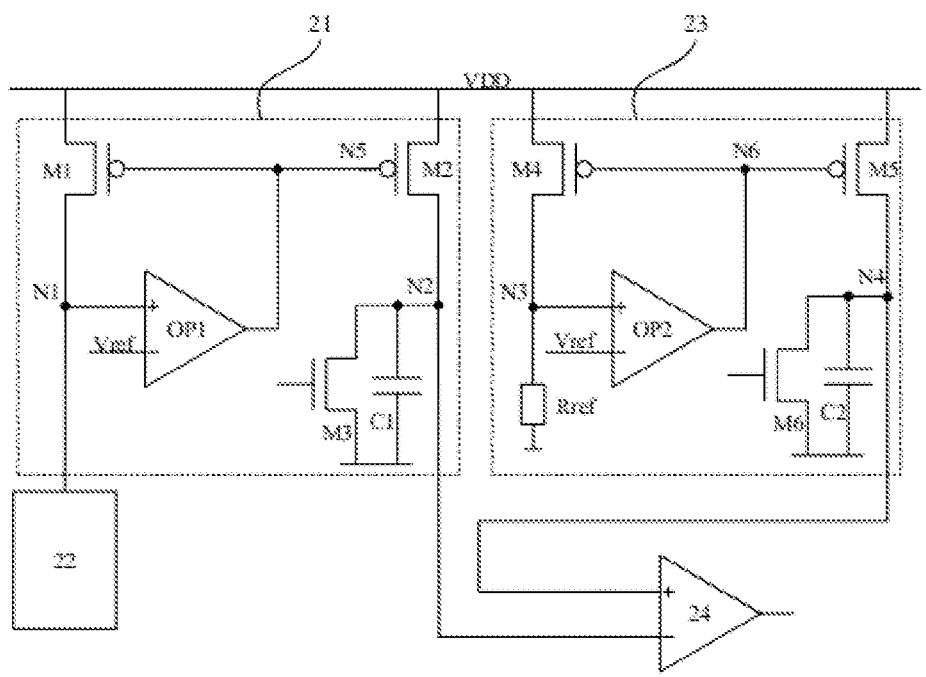
FIG. 4 is a schematic equivalent circuit diagram of the circuit shown in FIG. 3.

FIG. 4 is a schematic equivalent circuit diagram of the embodiment shown in FIG. 3.

Referring to FIG. 4, in embodiments of the present disclosure, a first amplifier OP1, a first switching element M1, and a second switching element M2 are used in a first current module 21 to convert the resistance of an anti-fuse storage unit to be detected into a current source to charge a second node N2, and a third switching element M3 is provided at the second node N2 to control a start time of charging the second node N2 by the current source or to clear the voltage of the second node N2. A second amplifier OP2, a fourth switching element M4, and a fifth switching element M5 are used in a second current module 23 to convert a reference resistance into a current source to charge a fourth node N4, and a sixth switching element M6 is provided at the fourth node N4 to control a start time of charging the fourth node N4 by the current source or to clear the voltage of the fourth node N4. Therefore, the determination of the resistance (i.e. storage state) of the anti-fuse storage unit to be detected is realized by detecting and comparing potentials of the second node N2 and the fourth node N4.

In one embodiment, the voltage at the second node N2 may be detected by using a parasitic capacitor C1 of the second node N2, and the voltage at the fourth node N4 may be detected by using a parasitic capacitor C2 of the fourth node N4. The parasitic capacitors C1, C2 are integrated parasitic capacitors, including parasitic capacitors at the input ends of the comparator 24.

Figure 5:
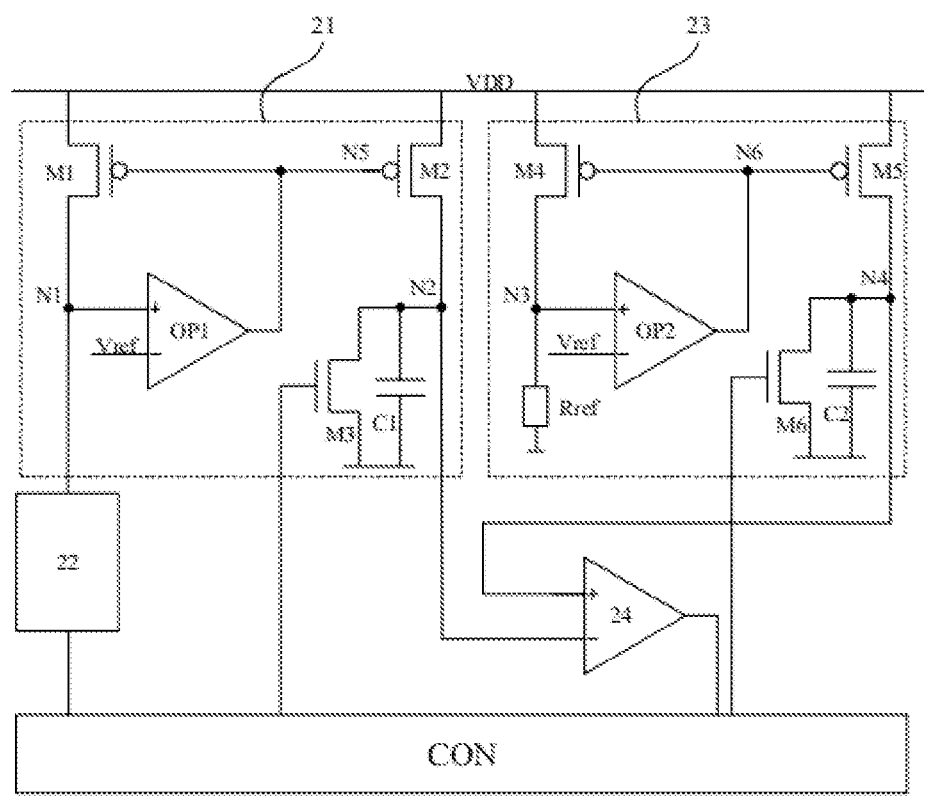
FIG. 5 is a schematic circuit diagram of a circuit for detecting a state of an anti-fuse storage unit in another embodiment of the present disclosure.

FIG. 5 is a schematic circuit diagram of a circuit for detecting a state of an anti-fuse storage unit in another embodiment of the present disclosure.

Referring to FIG. 5, in one embodiment, the anti-fuse storage unit array 22, the comparator 24, the third switching element M3, and the sixth switching element M6 are all connected to a controller CON. Exemplarily, the controller CON is connected to word lines of each anti-fuse storage unit in the anti-fuse storage unit array 22, is connected to an output end of the comparator 24, and is connected to the control ends of the third switching element M3 and the sixth switching element M6.

FIG. 6 is a flowchart of a detection method implemented by a controller CON in the embodiment shown in FIG. 5.

Referring to FIG. 6, the controller CON may be configured to execute a detection method 600. The detection method 600 may include the following steps.

In step S1, a first control signal is output at a first time point through a word line of an anti-fuse storage unit to be detected, so that the anti-fuse storage unit to be detected is electrically connected to a bit line, and a second control signal is output to control a first current module to input a detection current to a first input end of a comparator and to control a second current module to input a reference current to a second input end of the comparator.

In step S2, an output signal of the comparator is acquired at a second time point to determine a storage state of the anti-fuse storage unit to be detected, where the second time point follows the first time point.

The control method of FIG. 6 will now be described with reference to FIGS. 2-5.

After the first control signal is output to the word line of the anti-fuse storage unit to be detected at the first time point, the resistance of a path where the first node N1 is located varies according to a breakdown state of the anti-fuse storage unit. Through the arrangement of the amplifier OP1, the voltage of the first node N1 may maintain the same voltage value as a reference voltage Vref connected to the amplifier OP1, so that a first current is generated in the path where the first node N1 is located, and the first current is negatively correlated with the resistance of the anti-fuse storage unit to be detected. Meanwhile, due to the arrangement of the first switching element M1 and the second switching element M2, a second current is generated in a path where the second node N2 is located, the second current is constantly proportional to the first current, and the proportion is determined by the sizes and performances of the first switching element M1 and the second switching element M2. That is, the second current is also negatively correlated with the resistance of the anti-fuse storage unit to be detected. The larger the resistance of the anti-fuse storage unit to be detected is, the smaller the second current is. The smaller the resistance of the anti-fuse storage unit to be detected is, the larger the second current is.

The second current charges the second node N2. The larger the second current is, the higher a charging speed of the second node N2 is, and the higher a voltage variation speed of the second node N2 is. The smaller the second current is, the lower the charging speed of the second node N2 is, and the lower the voltage variation speed of the second node N2 is. As can be seen from the above analysis, the larger the resistance of the anti-fuse storage unit to be detected is, the smaller the second current is, and the lower the voltage variation speed of the second node N2 is. The smaller the resistance of the anti-fuse storage unit to be detected is, the larger the second current is, and the higher the voltage variation speed of the second node N2 is.

Similarly, in the second current module 23, the larger the reference resistance is, the lower a voltage variation speed of the fourth node N4 is. The smaller the reference resistance is, the higher the voltage variation speed of the fourth node N4 is.

By controlling the first current module 21 and the second current module 23 to simultaneously charge the second node N2 and the fourth node N4 at the first time point, and comparing the voltage of the second node N2 with the voltage of the fourth node N4 at the second time point by using the comparator 24, a comparison result of the resistance of the anti-fuse storage unit to be detected and the reference resistance can be determined, so that a storage state of the anti-fuse storage unit to be detected is further determined. In one embodiment, the comparator 24 may be a differential amplifier.

The method of acquiring an output signal of the comparator 24 may be either to read the output signal of the comparator 24 at the second time point, or to control, through an enabling pin of the comparator 24, the comparator 24 to transform to an enabled state at the second time point, and to output a comparison result of the voltage of the second node N2 with the voltage of the fourth node N4.

By using the comparator 24 for detection at an appropriate time point, a turning point of the comparator can be accurately controlled to prevent storage state detection errors caused by fluctuation of resistances of anti-fuse storage units or drift of turning points of logic gates. Therefore, in the embodiments of the present disclosure, the selection of the second time point is an important means of implementing accurate detection.

Figure 7:
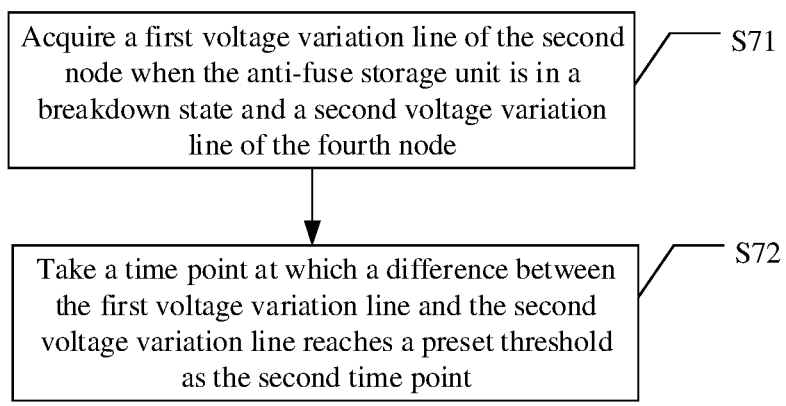
FIG. 7 is a schematic diagram of a manner of determining a second time point according to an embodiment of the present disclosure.

FIG. 7 is a schematic diagram of a manner of determining a second time point according to an embodiment of the present disclosure.

Referring to FIG. 7, in an exemplary embodiment of the present disclosure, the second time point may be determined according to the following manners.

In step S71, a first voltage variation line of the second node when the anti-fuse storage unit is in a breakdown state and a second voltage variation line of the fourth node are acquired.

In step S72, a time point at which a difference between the first voltage variation line and the second voltage variation line reaches a preset threshold is taken as the second time point.

Figure 8:
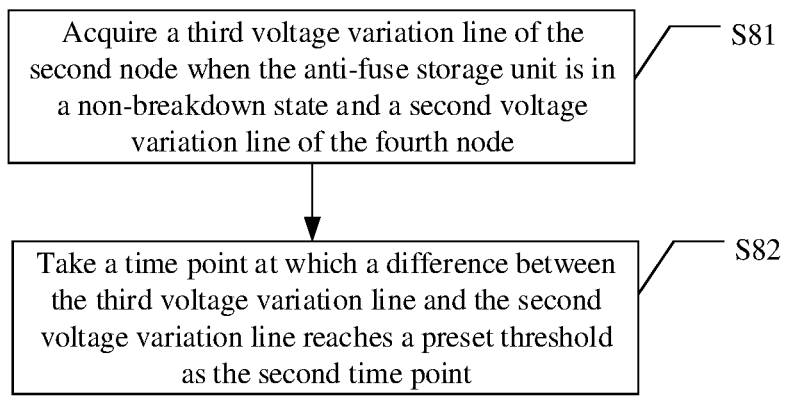
FIG. 8 is a schematic diagram of a manner of determining a second time point according to another embodiment of the present disclosure.

FIG. 8 is a schematic diagram of a manner of determining a second time point according to another embodiment of the present disclosure.

Referring to FIG. 8, in an exemplary embodiment of the present disclosure, the second time point may be determined according to the following manners.

In step S81, a third voltage variation line of the second node when the anti-fuse storage unit is in a non-breakdown state and a second voltage variation line of the fourth node are acquired.

In step S82, a time point at which a difference between the third voltage variation line and the second voltage variation line reaches a preset threshold is taken as the second time point.

In the embodiments of the present disclosure, the preset threshold is greater than a differential input voltage threshold of the comparator.

The embodiment shown in FIGS. 7 and 8 will now be described with reference to FIGS. 9 and 10.

Figure 9:
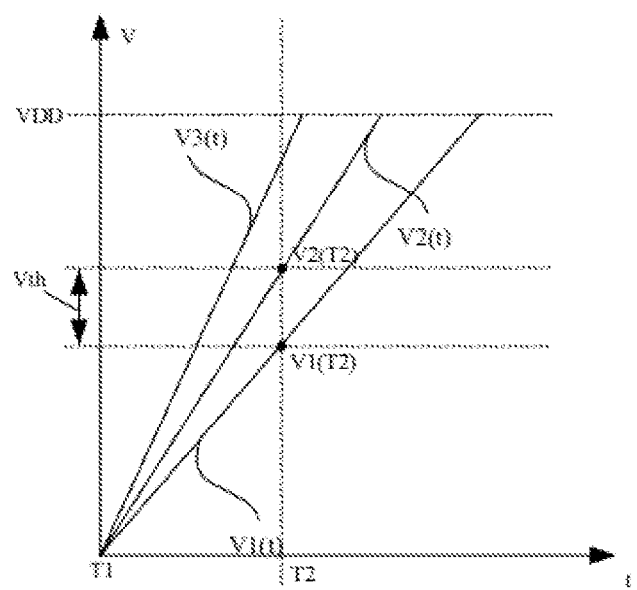
FIG. 9 is a schematic diagram showing a voltage variation line of a second node when an anti-fuse storage unit is in a non-breakdown state and a voltage variation line of a fourth node.
Figure 10:
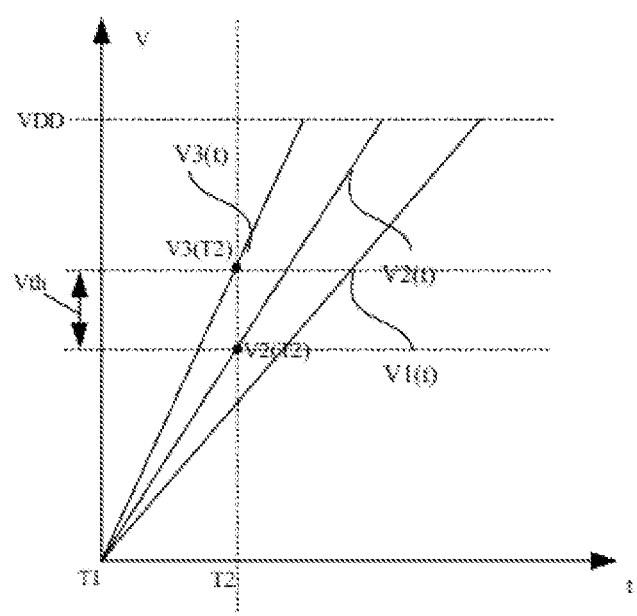
FIG. 10 is a schematic diagram showing a voltage variation line of a second node and a voltage variation line of a fourth node when an anti-fuse storage unit is in a breakdown state.

FIGS. 9 and 10 are schematic diagrams of a first voltage variation line, a second voltage variation line, and a third voltage variation line.

It is assumed that a minimum resistance of the anti-fuse storage unit in a non-breakdown state is R1 and a maximum resistance in a breakdown state is R2. R1 and R2 are both obtained from statistical data, and are obtained by carrying out statistical analysis on R1 and R2 during the development and production of the anti-fuse storage unit.

Referring to FIG. 9, in the first current module 21, when the path resistance includes R1, a first voltage variation line in which voltage $V1(t)$ of the second node N2 increases from 0 to VDD from a first time point T1 as a function of time t is:

$$V1(t) = I_1(t) * t/C1 \quad (1)$$

$I_1(t)$ is the current of the second node N2 when the path resistance includes R1.

Referring to FIG. 10, when the path resistance includes R2, a third voltage variation line in which the voltage $V3(t)$ of the second node N2 increases from 0 to VDD from the first time point T1 as a function of time t is:

$$V3(t) = I_3(t) * t/C1 \quad (2)$$

$I_3(t)$ is the current of the second node N2 when the path resistance includes R2.

Referring to FIGS. 9 and 10, in the second current module 23, since the reference resistance Rref is constant, a second voltage variation line in which the voltage $V2(t)$ of the fourth node N4 increases from 0 to VDD from the first time point T1 as a function of time t is:

$$V2(t) = I_2(t) * t/C2 \quad (3)$$

$I_2(t)$ is a constant current at the fourth node N4.

As can be seen from Formulas (1)-(3) and FIGS. 9 and 10, when R2<Rref<R1, if C1=C2, $V1(t)<V2(t)<V3(t)$, then $$\Delta V_1(t) = V2(t) - V1(t) = (I_2(t) - I_1(t)) * t/C1 \quad (4)$$

$$\Delta V_2(t) = V3(t) - V2(t) = (I_3(t) - I_2(t)) * t/C1 \quad (5)$$

Next, it is possible to set either the time at which $\Delta V_1/(t)$ is equal to a preset threshold as a second time point T2 (FIG. 9) or the time at which $\Delta V_2(t)$ equal to the preset threshold as a second time point T2 (FIG. 10). The preset threshold may be determined according to parameters of the comparator 24. For example, the preset threshold is greater than a differential input voltage threshold of the comparator 24. The larger the preset threshold is, the higher the detection accuracy is. The smaller the preset threshold is, the shorter the detection time is. The differential input voltage threshold mentioned in the embodiments of the present disclosure refers to a minimum voltage difference between a non-inverting input end and an inverting input end which can be detected by the comparator. The minimum voltage difference is correlated with design parameters, process deviation, temperature, an input voltage value, etc. of the comparator. Therefore, those skilled in the art would be able to automatically adjust a set value of the preset threshold according to actual conditions, so as to achieve a common optimal solution of detection accuracy and detection time.

It will be appreciated that both the third switching element M3 and the sixth switching element M6 are in an on state by default in order to control the voltages of both the second node N2 and the fourth node N4 to be zero before the detection. Both the third switching element M3 and the sixth switching element M6 may be, for example, N-type transistors. At the start of the detection, the third switching element M3 and the sixth switching element M6 are turned off under the control of the controller, and the voltages of the second node N2 and the fourth node N4 start to be increased. By using the third switching element M3 and the sixth switching element M6 to control the charging start time of the second node N2 and the fourth node N4, a more accurate detection result can be obtained, and the detection precision can be improved effectively.

In some embodiments, a ZQ calibration resistor may be used as a reference resistor Rref.

Figure 11:
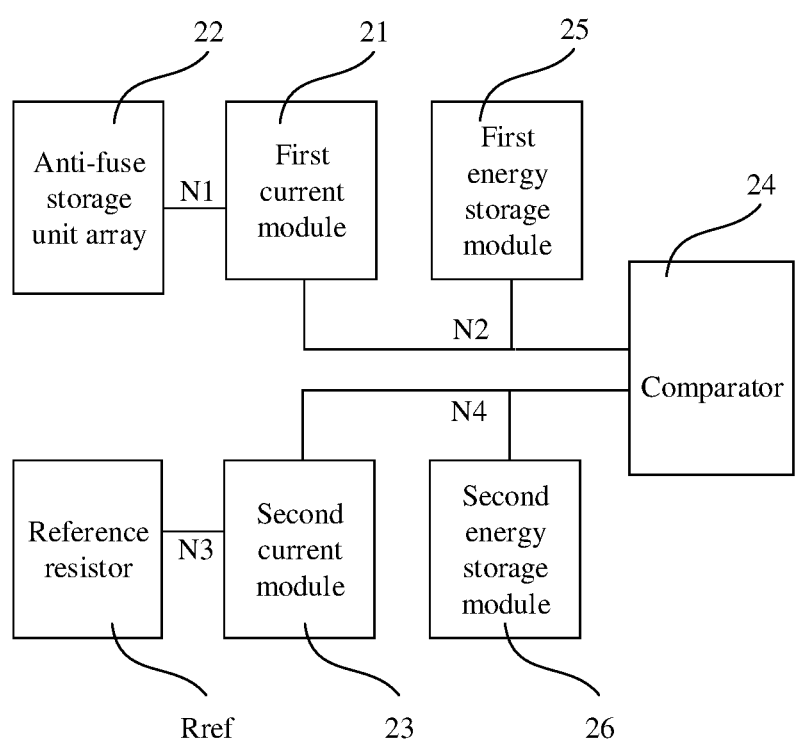
FIG. 11 is a schematic circuit diagram of a circuit for detecting a state of an anti-fuse storage unit in another embodiment of the present disclosure.

FIG. 11 is a schematic circuit diagram of a circuit for detecting a state of an anti-fuse storage unit in another embodiment of the present disclosure.

Referring to FIG. 11, in order to reduce random deviations of the voltage variation line caused by deviations of parasitic capacitances of the second node N2 and the fourth node N4, additional energy storage modules may be added to the second node N2 and the fourth node N4, respectively. That is, the detection circuit 200 may further include a first energy storage module 25 and a second energy storage module 26.

The first energy storage module 25 has a first end connected to the second node N2 and a grounded second end.

The second energy storage module 26 has a first end connected to the fourth node N4 and a grounded second end.

Figure 12:
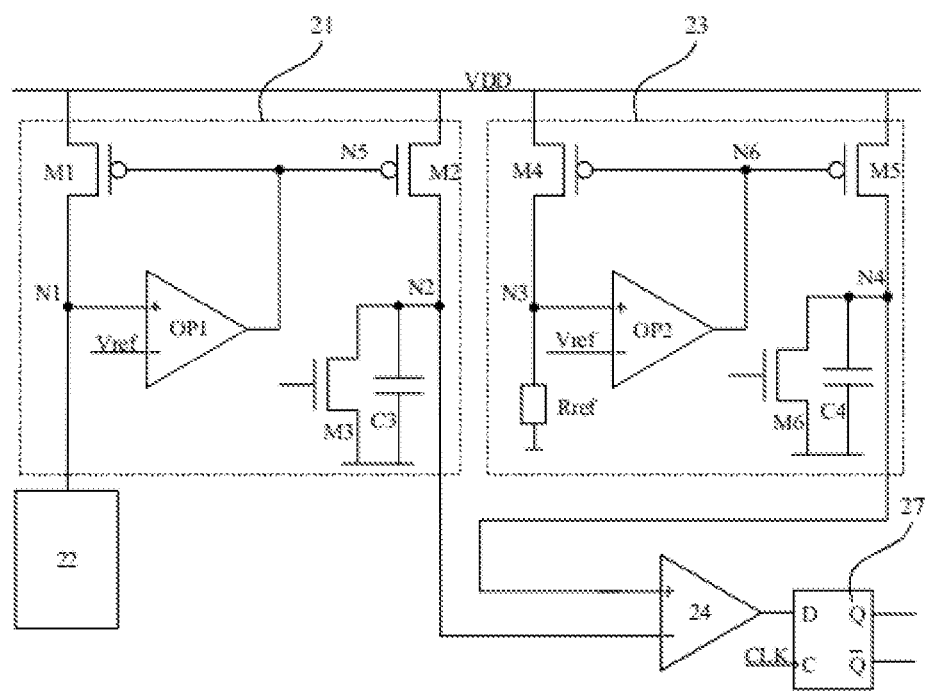
FIG. 12 is a schematic circuit diagram of a circuit for detecting a state of an anti-fuse storage unit in yet another embodiment of the present disclosure.

The first energy storage module 25 and the second energy storage module 26 may, for example, be provided as a first detection capacitor C3 and a second detection capacitor C4 (as shown in FIG. 12). The first detection capacitor C3 has the same function as that of the parasitic capacitor C1, i.e., both for detecting the voltage of the second node N2. The second detection capacitor C4 has the same function as that of the parasitic capacitor C2, i.e., both for detecting the voltage of the fourth node N4. At this moment, C1 in Formulas (1) to (5) may be replaced by C3, and C2 in Formulas (1) to (5) may be replaced by C4.

For convenience of calculation, capacitance values of the first detection capacitor C3 and the second detection capacitor C4 may be set to be identical. In other embodiments of the present disclosure, other energy storage solutions may also be used for the second node N2 and the fourth node N4, and the present disclosure is not particularly limited thereto.

FIG. 12 is a schematic circuit diagram of a circuit for detecting a state of an anti-fuse storage unit in yet another embodiment of the present disclosure.

Referring to FIG. 12, in other embodiments of the present disclosure, the detection circuit 200 may further include a trigger 27.

The trigger 27 has an input end connected to an output end of the comparator 24, and first and second output ends both connected to the controller CON.

The trigger 27 may be, for example, a D trigger for latching the output signal of the comparator 24 to facilitate reading by the controller CON. Those skilled in the art would be able to set the model of the trigger 27, and the present disclosure is not limited thereto.

It will be appreciated that the arrangement of the first energy storage module 25, the second energy storage module 26 or the trigger 27 does not affect the implementation of the control method shown in FIG. 6 and does not affect the selection logic for the second time point.

Figure 13:
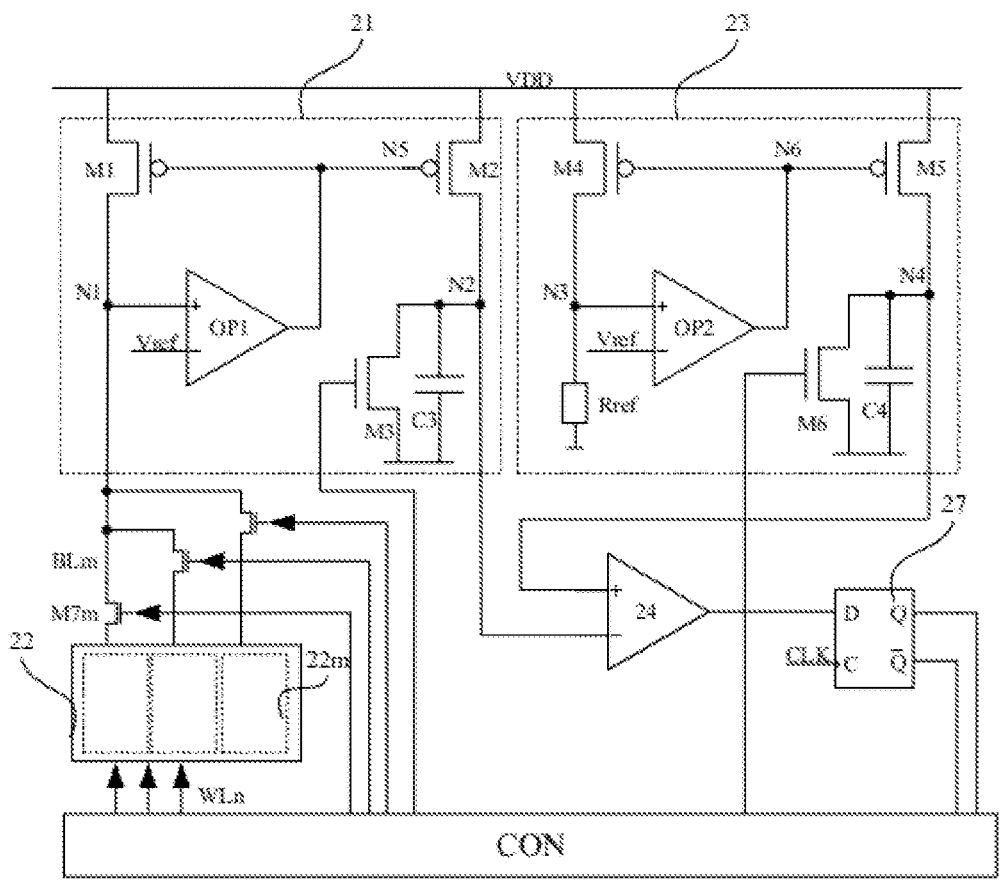
FIG. 13 is a schematic structure diagram of a circuit for detecting a state of an anti-fuse storage unit in yet another embodiment of the present disclosure.

FIG. 13 is a schematic circuit diagram of a circuit for detecting a state of an anti-fuse storage unit in yet another embodiment of the present disclosure.

Referring to FIG. 13, in one embodiment, the first node N1 is connected to a plurality of bit lines. The anti-fuse storage unit array 22 may include a plurality of anti-fuse storage unit sub-arrays 22$m$ (m is a bit line serial number) and a plurality of seventh switching elements M7$m$, each corresponding to a respective one of the anti-fuse storage unit sub-arrays 22$m$.

Each of the anti-fuse storage unit sub-arrays 22$m$ corresponds to a respective bit line BL$m$, and each of the anti-fuse storage unit sub-arrays 22$m$ includes a plurality of anti-fuse storage units.

A first end of each seventh switching element M7$m$ is connected to the bit line BL$m$ of the corresponding anti-fuse storage unit sub-array 22$m$, a second end of each seventh switching element M7$m$ is connected to the third node N3, a control end of each seventh switching element M7$m$ is connected to the controller CON, and the seventh switching elements M7$m$ is in an off state by default.

By connecting the plurality of anti-fuse storage unit sub-arrays 22$m$ at the first node and sharing the anti-fuse storage state detection circuit, the storage states of the anti-fuse storage units in the plurality of anti-fuse storage unit sub-arrays 22$m$ are detected, so that the circuit area can be saved greatly. In one embodiment, the first node N1 may be simultaneously connected to 16 bit lines in the manner shown in FIG. 13.

Figure 14:
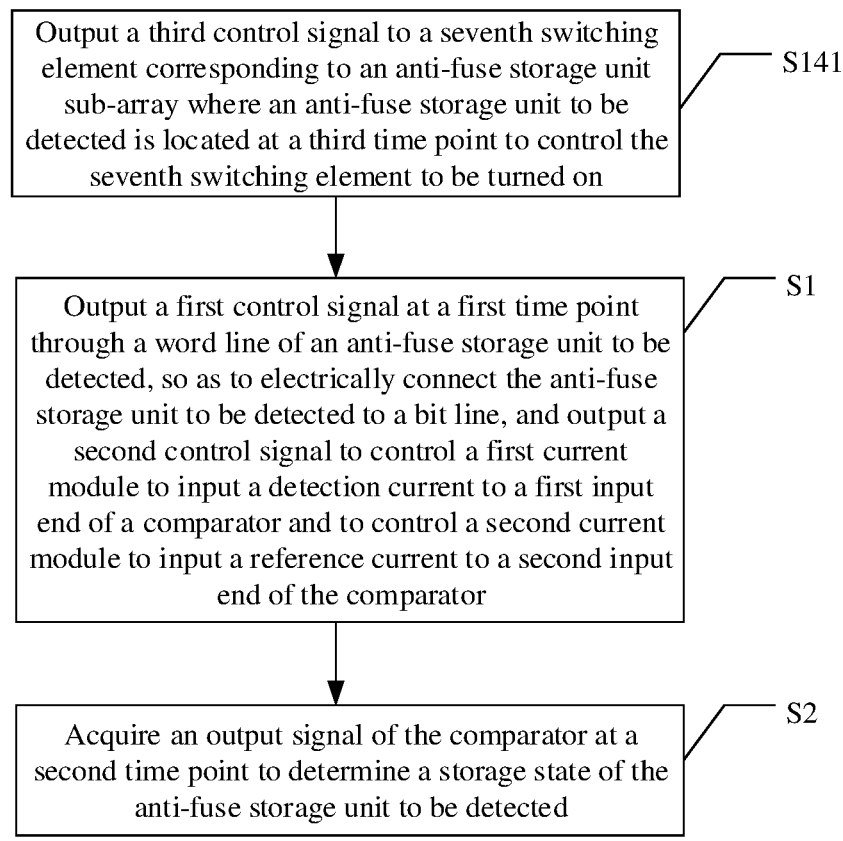
FIG. 14 is a flowchart of a method for detecting a controller for the circuit shown in FIG. 13.

FIG. 14 is a flowchart of a detection method corresponding to the circuit shown in FIG. 13.

Referring to FIG. 14, in the circuit shown in FIG. 13, the controller CON may be configured to execute the following method.

In step S141, a third control signal is output to a seventh switching element corresponding to an anti-fuse storage unit sub-array where an anti-fuse storage unit to be detected is located at a third time point, to control the seventh switching element to be turned on.

In step S1, a first control signal is output to a word line of an anti-fuse storage unit to be detected at a first time point, so as to electrically connect the anti-fuse storage unit to be detected to a bit line, and a second control signal is output to control a first current module to input a detection current to a first input end of a comparator and to control a second current module to input a reference current to a second input end of the comparator.

In step S2, an output signal of the comparator is acquired at a second time point, to determine a storage state of the anti-fuse storage unit to be detected.

Both the first time point and the third time point precede the second time point.

That is, the method shown in FIG. 6 may further include step S141. The execution order of step S141 and step S1 may be exchanged.

In the embodiment shown in FIG. 14, the third time point may precede the first time point or follow the first time point, or may be equal to the first time point, as long as both the third time point and the first time point precede the second time point, so as to turn on a charging path before the voltage of the second node N2 starts to be detected at the second time point.

When the seventh switching element is a P-type transistor, the third control signal is at a low level. When the seventh switching element is an N-type transistor, the third control signal is at a high level. When the seventh switching element is another type of element, the third control signal may also be another type of signal, and the present disclosure is not particularly limited thereto.

According to the circuit for detecting the state of the anti-fuse storage unit and the method for detecting the state of the anti-fuse storage unit provided by the embodiments of the present disclosure, the current correlated with the resistance of an anti-fuse storage unit to be detected is generated by using a first current module at a first time point to charge a second node N2, the current correlated with a reference resistance is generated by using a second current module to charge a fourth node N4, the voltages of the second node N2 and the fourth node N4 are compared by using a comparator at a second time point, and an output turning point of the comparator can be controlled accurately. The second time point for detection is judged by using a difference between a voltage variation line of the second node N2 and a voltage variation line of the fourth node N4, so that the voltage misjudgment probability can be reduced as much as possible, the output of the comparator is more accurate, and the misjudgment of storage states of anti-fuse storage units caused by fluctuation of the resistances of anti-fuse storage units and drift of the turning voltages of logic gates in the related art is avoided.

According to an aspect of the present disclosure, a memory device is provided, which includes the circuit for detecting the state of the anti-fuse storage unit as described in any one of the above embodiments. The memory device may be, for example, a Dynamic Random Access Memory (DRAM).

An object of the present disclosure is to provide a circuit for detecting a state of an anti-fuse storage unit and a memory device applying the circuit for overcoming the problem of inaccurate storage state detection results of anti-fuse storage units due to limitations and disadvantages of the related art at least to some extent.

According to a first aspect of the present disclosure, a circuit for detecting a state of an anti-fuse storage unit is provided, which may include a first current module, a second current module, and a comparator. The first current module may have a first end connected to an anti-fuse storage unit array through a first node and a second end connected to a second node. The anti-fuse storage unit array may include at least one bit line that may be each connected to the first node and a plurality of anti-fuse storage units. The first current module may be configured to output a detection current through the second node, the detection current being correlated with a resistance of an anti-fuse storage unit to be detected in the anti-fuse storage unit array. The second current module may have a first end connected to a first end of a reference resistor through a third node and a second end connected to a fourth node. A second end of the reference resistor may be grounded. The second current module may be configured to output a reference current through the fourth node, the reference current being correlated with a resistance of the reference resistor. The comparator may have a first input end connected to the second node and a second input end connected to the fourth node for detecting a storage state of the anti-fuse storage unit to be detected.

In an exemplary embodiment of the present disclosure, the first current module may include a first amplifier, a first switching element, a second switching element, and a third switching element. The first amplifier may have a first input end connected to a reference voltage, a second input end connected to the first node, and an output end connected to a fifth node. The first switching element may have a first end connected to a power voltage, a second end connected to the first node, and a control end connected to the fifth node. The second switching element may have a first end connected to the power voltage, a second end connected to the second node, and a control end connected to the fifth node. The third switching element may have a first end connected to the second node, a grounded second end, and a control end connected to a controller.

In an exemplary embodiment of the present disclosure, the second current module may include a second amplifier, a fourth switching element, a fifth switching element, and a sixth switching element. The second amplifier may have a first input end connected to the reference voltage, a second input end connected to the third node, and an output end connected to a sixth node. The fourth switching element may have a first end connected to the power voltage, a second end connected to the third node, and a control end connected to the sixth node. The fifth switching element may have a first end connected to the power voltage, a second end connected to the fourth node, and a control end connected to the sixth node. The sixth switching element may have a first end connected to the fourth node, a grounded second end, and a control end connected to a controller.

In an exemplary embodiment of the present disclosure, the circuit for detecting the state of the anti-fuse storage unit may further include a first energy storage module and a second energy storage module. The first energy storage module may have a first end connected to the second node and a grounded second end. The second energy storage module may have a first end connected to the fourth node and a grounded second end.

In an exemplary embodiment of the present disclosure, the circuit for detecting the state of the anti-fuse storage unit may further include a trigger, which may have an input end connected to an output end of the comparator.

In an exemplary embodiment of the present disclosure, the circuit for detecting the state of the anti-fuse storage unit may further include: a controller, connected to word lines of the plurality of anti-fuse storage units and the comparator, and configured to: output a first control signal through a word line of an anti-fuse storage unit to be detected at a first time point, so as to electrically connect the anti-fuse storage unit to be detected to a bit line, and output a second control signal to control the first current module to input the detection current to the first input end of the comparator and to control the second current module to input the reference current to the second input end of the comparator; and acquire an output signal of the comparator at a second time point to determine a storage state of the anti-fuse storage unit to be detected. The second time point may follow the first time point.

In an exemplary embodiment of the present disclosure, the second time point may be determined according to the following manners: acquiring a first voltage variation line of the second node when the anti-fuse storage unit is in a breakdown state and a second voltage variation line of the fourth node; and taking a time point at which a difference between the first voltage variation line and the second voltage variation line reaches a preset threshold as the second time point.

In an exemplary embodiment of the present disclosure, the second time point may be determined according to the following manners: acquiring a third voltage variation line of the second node when the anti-fuse storage unit is in a non-breakdown state and a second voltage variation line of the fourth node; and taking a time point at which a difference between the third voltage variation line and the second voltage variation line reaches a preset threshold as the second time point.

In an exemplary embodiment of the present disclosure, the reference resistor may be a ZQ calibration resistor.

In an exemplary embodiment of the present disclosure, the anti-fuse storage unit array may include: a plurality of anti-fuse storage unit sub-arrays, each corresponding to a bit line and including a plurality of anti-fuse storage units; and a plurality of seventh switching elements, each corresponding to a respective one of the anti-fuse storage unit sub-arrays, each of the seventh switching elements having a first end connected to the bit line of the respective anti-fuse storage unit sub-array and a second end connected to the first node, the seventh switching elements being in an off state by default.

In an exemplary embodiment of the present disclosure, a control end of each of the seventh switching elements may be connected to a controller configured to: output a third control signal to one of the seventh switching elements corresponding to one of anti-fuse storage unit sub-arrays, in which an anti-fuse storage unit to be detected may be located at a third time point to control the seventh switching element to be turned on; output a first control signal to a word line of the anti-fuse storage unit to be detected at a first time point, to electrically connect the anti-fuse storage unit to be detected may be electrically connected to a bit line, and output a second control signal to control the first current module to input the detection current to the first input end of the comparator and to control the second current module to input the reference current to the second input end of the comparator; and acquire an output signal of the comparator at a second time point to determine a storage state of the anti-fuse storage unit to be detected. The third time point may precede the second time point.

According to an aspect of the present disclosure, a method for detecting a state of an anti-fuse storage unit is provided, which may be applied to the circuit for detecting the state of the anti-fuse storage unit as described in any one of the above, and may include: outputting a first control signal to a word line of an anti-fuse storage unit to be detected at a first time point, to electrically connect the anti-fuse storage unit to be detected to a bit line, and outputting a second control signal to control a first current module to input a detection current to a first input end of a comparator and to control a second current module to input a reference current to a second input end of the comparator; and acquiring an output signal of the comparator at a second time point to determine a storage state of the anti-fuse storage unit to be detected. The second time point may follow the first time point.

In an exemplary embodiment of the present disclosure, an anti-fuse storage unit array may include: a plurality of anti-fuse storage unit sub-arrays, each corresponding to a bit line and including a plurality of anti-fuse storage units; and a plurality of seventh switching elements, each corresponding to a respective one of the anti-fuse storage unit sub-arrays, each having a first end connected to the bit line of the respective anti-fuse storage unit sub-array, a second end connected to the first node and a control end connected to a controller. The seventh switching elements may be in an off state by default. The method may further include: outputting a third control signal to one of the seventh switching elements corresponding to one of the anti-fuse storage unit sub-arrays, where the anti-fuse storage unit to be detected may be located, at a third time point, to control the seventh switching element to be turned on. The third time point may precede the second time point.

According to an aspect of the present disclosure, a memory device is provided, which may include the circuit for detecting the state of the anti-fuse storage unit as described in any one of the above.

According to the embodiments of the present disclosure, the resistance of the anti-fuse storage unit to be detected and reference resistance are reflected on the voltage of a second node and the voltage of a fourth node by using two current modules, the voltage of the second node and the voltage of the fourth node are compared by using a comparator to determine the resistance of the anti-fuse storage unit to be detected, and then a storage state of the anti-fuse storage unit to be detected is determined, so that a turning point can be accurately controlled, a more accurate detection result can be obtained, and the misjudgment of the storage state of the anti-fuse storage unit caused by fluctuation of the breakdown state resistances of anti-fuse storage units and drift of the turning points of logic gates is avoided.

It should be noted that although several modules or units of a device for action execution are mentioned in the above detailed description, such partitioning is not mandatory. In practice, the features and functions of two or more modules or units described above may be embodied in one module or unit according to implementations of the present disclosure. Conversely, features and functions of one module or unit described above may be embodied by a plurality of modules or units which are further divided.

After considering the specification and implementing the present disclosure disclosed here, other implementation solutions of the present disclosure would readily be conceivable to a person skilled in the art. The present application is intended to cover any variations, uses, or adaptations of the present disclosure following the general principles thereof and including such departures from the present disclosure as come within known or customary practice in the art. The specification and embodiments are only regarded as exemplary, and the true scope and concept of the present disclosure are indicated by the claims.

According to the embodiments of the present disclosure, the resistance of an anti-fuse storage unit to be detected and reference resistance are reflected on the voltage of a second node and the voltage of a fourth node by using two current modules, the voltage of the second node and the voltage of the fourth node are compared by using a comparator to determine the resistance of the anti-fuse storage unit to be detected, and then a storage state of the anti-fuse storage unit to be detected is determined, so that a turning point can be accurately controlled, a more accurate detection result can be obtained, and the misjudgment of the storage state of the anti-fuse storage unit caused by fluctuation of the breakdown state resistance of anti-fuse storage units and drift of the turning point of logic gates is avoided.

The invention claimed is:

1. A circuit for detecting a state of an anti-fuse storage unit, comprising:
a first current module, having a first end connected to an anti-fuse storage unit array through a first node and a second end connected to a second node, the anti-fuse storage unit array comprising at least one bit line, each connected to the first node and a plurality of anti-fuse storage units, and the first current module being configured to output a detection current through the second node, the detection current being correlated with a resistance of an anti-fuse storage unit to be detected in the anti-fuse storage unit array;
a second current module, having a first end connected to a first end of a reference resistor through a third node and a second end connected to a fourth node, a second end of the reference resistor being grounded, and the second current module being configured to output a reference current through the fourth node, the reference current being correlated with a resistance of the reference resistor; and
a comparator, having a first input end connected to the second node and a second input end connected to the fourth node for detecting a storage state of the anti-fuse storage unit to be detected.

2. The circuit for detecting the state of the anti-fuse storage unit of claim 1, wherein the first current module comprises:
a first amplifier, having a first input end connected to a reference voltage, a second input end connected to the first node, and an output end connected to a fifth node;
a first switching element, having a first end connected to a power voltage, a second end connected to the first node, and a control end connected to the fifth node;
a second switching element, having a first end connected to the power voltage, a second end connected to the second node, and a control end connected to the fifth node; and a third switching element, having a first end connected to the second node, a grounded second end, and a control end connected to a controller.

3. The circuit for detecting the state of the anti-fuse storage unit of claim 1, wherein the second current module comprises:
   a second amplifier, having a first input end connected to a reference voltage, a second input end connected to the third node, and an output end connected to a sixth node;
   a fourth switching element, having a first end connected to a power voltage, a second end connected to the third node, and a control end connected to the sixth node;
   a fifth switching element, having a first end connected to the power voltage, a second end connected to the fourth node, and a control end connected to the sixth node; and
   a sixth switching element, having a first end connected to the fourth node, a grounded second end, and a control end connected to a controller.

4. The circuit for detecting the state of the anti-fuse storage unit of claim 1, further comprising:
   a first energy storage module, having a first end connected to the second node and a grounded second end; and
   a second energy storage module, having a first end connected to the fourth node and a grounded second end.

5. The circuit for detecting the state of the anti-fuse storage unit of claim 1, further comprising:
   a trigger, having an input end connected to an output end of the comparator.

6. The circuit for detecting the state of the anti-fuse storage unit of claim 1, further comprising:
   a controller, connected to word lines of the plurality of anti-fuse storage units and the comparator, and configured to:
      output a first control signal through a word line of the anti-fuse storage unit to be detected at a first time point, so as to electrically connect the anti-fuse storage unit to be detected to a bit line, and output a second control signal to control the first current module to input the detection current to the first input end of the comparator and to control the second current module to input the reference current to the second input end of the comparator; and
      acquire an output signal of the comparator at a second time point to determine the storage state of the anti-fuse storage unit to be detected,
      wherein the second time point follows the first time point.

7. The circuit for detecting the state of the anti-fuse storage unit of claim 6, wherein the second time point is determined according to the following manners:
   acquiring a first voltage variation line of the second node when the anti-fuse storage unit is in a breakdown state and a second voltage variation line of the fourth node; and
   taking a time point at which a difference between the first voltage variation line and the second voltage variation line reaches a preset threshold as the second time point.

8. The circuit for detecting the state of the anti-fuse storage unit of claim 6, wherein the second time point is determined according to the following manners:
   acquiring a third voltage variation line of the second node when the anti-fuse storage unit is in a non-breakdown state and a second voltage variation line of the fourth node; and
   taking a time point at which a difference between the third voltage variation line and the second voltage variation line reaches a preset threshold as the second time point.

9. The circuit for detecting the state of the anti-fuse storage unit of claim 1, wherein the reference resistor is a ZQ calibration resistor.

10. The circuit for detecting the state of the anti-fuse storage unit of claim 1, wherein the anti-fuse storage unit array comprises:
    a plurality of anti-fuse storage unit sub-arrays, each corresponding to a bit line and comprising the plurality of anti-fuse storage units; and
    a plurality of seventh switching elements, each corresponding to a respective one of the plurality of anti-fuse storage unit sub-arrays, each of the plurality of seventh switching elements having a first end connected to the bit line of the respective anti-fuse storage unit sub-array and a second end connected to the first node, the plurality of seventh switching elements being in an off state by default.

11. The circuit for detecting the state of the anti-fuse storage unit of claim 10, wherein a control end of each of the plurality of seventh switching elements is connected to a controller configured to:
    output a third control signal to one of the plurality of seventh switching elements corresponding to one of the plurality of anti-fuse storage unit sub-arrays, in which the anti-fuse storage unit to be detected is located at a third time point, to control the seventh switching element to be turned on;
    output a first control signal to a word line of the anti-fuse storage unit to be detected at a first time point, to electrically connect the anti-fuse storage unit to be detected to a bit line, and output a second control signal to control the first current module to input the detection current to the first input end of the comparator and to control the second current module to input the reference current to the second input end of the comparator; and
    acquire an output signal of the comparator at a second time point to determine the storage state of the anti-fuse storage unit to be detected,
    wherein the third time point precedes the second time point.

12. A method for detecting a state of an anti-fuse storage unit, applied to a circuit for detecting the state of the anti-fuse storage unit, the method comprising:
    outputting a first control signal to a word line of the anti-fuse storage unit to be detected at a first time point, to electrically connect the anti-fuse storage unit to be detected to a bit line, and
    outputting a second control signal to control a first current module to input a detection current to a first input end of a comparator and to control a second current module to input a reference current to a second input end of the comparator; and
    acquiring an output signal of the comparator at a second time point to determine a storage state of the anti-fuse storage unit to be detected,
    wherein the second time point follows the first time point;
    wherein the first current module has a first end connected to an anti-fuse storage unit array through a first node and a second end connected to a second node, the anti-fuse storage unit array comprises at least one bit line, each connected to the first node and a plurality of anti-fuse storage units, and the first current module is configured to output the detection current through the second node, the detection current being correlated with a resistance of the anti-fuse storage unit to be detected in the anti-fuse storage unit array;

wherein the second current module has a first end connected to a first end of a reference resistor through a third node and a second end connected to a fourth node, a second end of the reference resistor is grounded, and the second current module is configured to output the reference current through the fourth node, the reference current being correlated with a resistance of the reference resistor;

wherein the second time point is determined according to the following manners:
acquiring a first voltage variation line of the second node when the anti-fuse storage unit is in a breakdown state and a second voltage variation line of the fourth node; and
taking a time point at which a difference between the first voltage variation line and the second voltage variation line reaches a preset threshold as the second time point; or the second time point is determined according to the following manners:
acquiring a third voltage variation line of the second node when the anti-fuse storage unit is in a non-breakdown state and the second voltage variation line of the fourth node; and
taking a time point at which a difference between the third voltage variation line and the second voltage variation line reaches the preset threshold as the second time point.

13. The method for detecting the state of the anti-fuse storage unit of claim 12, further comprising:
outputting a third control signal to a seventh switching element corresponding to an anti-fuse storage unit sub-array, in which the anti-fuse storage unit to be detected is located, at a third time point, to control the seventh switching element to be turned on, wherein the third time point precedes the second time point.

14. A memory device, comprising a circuit for detecting a state of an anti-fuse storage unit, comprising:
a first current module, having a first end connected to an anti-fuse storage unit array through a first node and a second end connected to a second node, the anti-fuse storage unit array comprising at least one bit line, each connected to the first node and a plurality of anti-fuse storage units, and the first current module being configured to output a detection current through the second node, the detection current being correlated with a resistance of an anti-fuse storage unit to be detected in the anti-fuse storage unit array;
a second current module, having a first end connected to a first end of a reference resistor through a third node and a second end connected to a fourth node, a second end of the reference resistor being grounded, and the second current module being configured to output a reference current through the fourth node, the reference current being correlated with a resistance of the reference resistor; and
a comparator, having a first input end connected to the second node and a second input end connected to the fourth node for detecting a storage state of the anti-fuse storage unit to be detected.

15. The memory device of claim 14, wherein the first current module comprises:
a first amplifier, having a first input end connected to a reference voltage, a second input end connected to the first node, and an output end connected to a fifth node;
a first switching element, having a first end connected to a power voltage, a second end connected to the first node, and a control end connected to the fifth node;
a second switching element, having a first end connected to the power voltage, a second end connected to the second node, and a control end connected to the fifth node; and
a third switching element, having a first end connected to the second node, a grounded second end, and a control end connected to a controller.

16. The memory device of claim 14, wherein the second current module comprises:
a second amplifier, having a first input end connected to a reference voltage, a second input end connected to the third node, and an output end connected to a sixth node;
a fourth switching element, having a first end connected to a power voltage, a second end connected to the third node, and a control end connected to the sixth node;
a fifth switching element, having a first end connected to the power voltage, a second end connected to the fourth node, and a control end connected to the sixth node; and
a sixth switching element, having a first end connected to the fourth node, a grounded second end, and a control end connected to a controller.

17. The memory device of claim 14, wherein the circuit for detecting the state of the anti-fuse storage unit further comprises:
a first energy storage module, having a first end connected to the second node and a grounded second end; and
a second energy storage module, having a first end connected to the fourth node and a grounded second end.

18. The memory device of claim 14, wherein the circuit for detecting the state of the anti-fuse storage unit further comprises:
a trigger, having an input end connected to an output end of the comparator.

19. The memory device of claim 14, wherein the circuit for detecting the state of the anti-fuse storage unit further comprises:
a controller, connected to word lines of the plurality of anti-fuse storage units and the comparator, and configured to:
output a first control signal through a word line of the anti-fuse storage unit to be detected at a first time point, so as to electrically connect the anti-fuse storage unit to be detected to a bit line, and output a second control signal to control the first current module to input the detection current to the first input end of the comparator and to control the second current module to input the reference current to the second input end of the comparator; and
acquire an output signal of the comparator at a second time point to determine the storage state of the anti-fuse storage unit to be detected,
wherein the second time point follows the first time point.

20. The memory device of claim 19, wherein the second time point is determined according to the following manners:

acquiring a first voltage variation line of the second node when the anti-fuse storage unit is in a breakdown state and a second voltage variation line of the fourth node; and taking a time point at which a difference between the first voltage variation line and the second voltage variation line reaches a preset threshold as the second time point.

\* \* \* \* \*